United States Patent
Satoh et al.

(10) Patent No.: US 7,790,358 B2
(45) Date of Patent: Sep. 7, 2010

(54) PATTERN FORMATION METHOD, ELECTRONIC CIRCUIT MANUFACTURED BY THE SAME, AND ELECTRONIC DEVICE USING THE SAME

(75) Inventors: Ryohei Satoh, Minoh (JP); Yoshinori Iwata, Osaka (JP); Koji Nakagawa, Osaka (JP); Reo Usui, Minoh (JP)

(73) Assignee: Asahi Glass Company, Limited, Tokyo (JP)

( * ) Notice: Subject to any disclaimer, the term of this patent is extended or adjusted under 35 U.S.C. 154(b) by 200 days.

(21) Appl. No.: 11/431,504

(22) Filed: May 11, 2006

(65) Prior Publication Data

US 2006/0240338 A1    Oct. 26, 2006

Related U.S. Application Data

(63) Continuation of application No. PCT/JP2004/016599, filed on Nov. 9, 2004.

(30) Foreign Application Priority Data

Nov. 11, 2003   (JP) .............................. 2003-381662
Jul. 1, 2004    (JP) .............................. 2004-195306

(51) Int. Cl.
    *H01L 21/00*    (2006.01)
(52) U.S. Cl. .................. 430/312; 430/394; 430/311
(58) Field of Classification Search .................. 430/5, 430/311–313, 394; 216/40
    See application file for complete search history.

(56) References Cited

U.S. PATENT DOCUMENTS

| | | | | |
|---|---|---|---|---|
| 4,707,218 A | * | 11/1987 | Giammarco et al. | ........ 438/421 |
| 4,774,171 A | * | 9/1988 | Zahn et al. | .................. 430/192 |
| 5,087,535 A | * | 2/1992 | Hirokane et al. | ................ 430/5 |
| 5,185,055 A | * | 2/1993 | Temple et al. | .................. 216/40 |
| 5,874,011 A | * | 2/1999 | Ehrlich | ........................ 216/65 |
| 6,265,129 B1 | * | 7/2001 | Takahashi et al. | ........... 430/192 |
| 6,605,412 B2 | * | 8/2003 | Iwata et al. | .................. 430/311 |
| 7,772,778 | | 3/2007 | Satoh et al. | |

(Continued)

FOREIGN PATENT DOCUMENTS

JP     52-15267     2/1977

(Continued)

OTHER PUBLICATIONS

English Language Translation of JP 06013356, Jan. 1994.*

*Primary Examiner*—Mark F Huff
*Assistant Examiner*—Stewart A Fraser
(74) *Attorney, Agent, or Firm*—Oblon, Spivak, McClelland, Maier & Neustadt, L.L.P.

(57) ABSTRACT

There is provided a method for forming a continuous thin film circuit pattern with good precision, at low cost and with low environmental burden; an electronic circuit fabricated by the same, and an electronic device including the same.

There are a step for forming a mask layer 2 on a substrate 1; a step for forming an opening pattern in the mask layer 2; a step for forming a thin film 3 on the substrate 1 and on the mask layer 2; and a step for removing, from the substrate 1, the mask layer 2 and a portion of the thin film 3 formed on the mask layer 2; wherein the opening pattern is formed under a dry condition.

3 Claims, 16 Drawing Sheets

U.S. PATENT DOCUMENTS

| | | |
|---|---|---|
| 2006/0240338 A1 | 10/2006 | Satoh et al. |
| 2009/0205851 A1 | 8/2009 | Satoh et al. |

FOREIGN PATENT DOCUMENTS

| | | | |
|---|---|---|---|
| JP | 53-110070 | 9/1978 | |
| JP | 56-81954 | 7/1981 | |
| JP | 57-212445 | 12/1982 | |
| JP | A-59-124728 | 7/1984 | |
| JP | 60-194453 | 10/1985 | |
| JP | 61-65455 | 4/1986 | |
| JP | 401154156 A * | 6/1989 | 430/5 |
| JP | 1-179328 | 7/1989 | |
| JP | 1-236658 | 9/1989 | |
| JP | 4-94887 | 3/1992 | |
| JP | A-04-079213 | 3/1992 | |
| JP | 4-305912 | 10/1992 | |
| JP | 6-13356 | 1/1994 | |
| JP | 6-196399 | 7/1994 | |
| JP | 7-29846 | 1/1995 | |
| JP | 7-78820 | 3/1995 | |
| JP | 7-168368 | 7/1995 | |
| JP | 8-22968 | 1/1996 | |
| JP | 8-315981 | 11/1996 | |
| JP | 10-20509 | 1/1998 | |
| JP | 2989064 | 10/1999 | |
| JP | 11-317418 | 11/1999 | |
| JP | 11-339574 | 12/1999 | |
| JP | 3028094 | 2/2000 | |
| JP | 2001-183848 | 7/2001 | |
| JP | A-2001-281440 | 10/2001 | |
| JP | 2002-75639 | 3/2002 | |
| JP | 2002-134004 | 5/2002 | |
| JP | 287905 | 10/2003 | |

* cited by examiner

PATTERN FORMATION METHOD, ELECTRONIC CIRCUIT MANUFACTURED BY THE SAME, AND ELECTRONIC DEVICE USING THE SAME

FIELD OF THE INVENTION

The present invention relates to a method for forming a pattern, an electronic circuit fabricated by the same, and an electronic device using the same, such as PDP. More specifically, the present invention relates to a method for forming a circuit pattern comprising a thin film, which is applicable to, e.g., semiconductor integrated circuits or electronic circuits, an electronic circuit fabricated by the same, and any kind of electronic device using a circuit pattern comprising a thin film, which is applicable to, e.g., semiconductor devices, various kinds of computers or various kinds of display devices.

DISCUSSION OF BACKGROUND

Heretofore, all kinds of electronic devices, which are applied to computers, communication, information appliances, various kinds of display devices or the like, have used a circuit pattern, which comprises a thin film formed on a substrate and made of metal or an insulating material. In order to copy with the advanced information society rapidly growing, such a circuit pattern is required to be highly integrated (be more precise) and to have a larger area.

In general, a method using a photolithography etching process has been adopted in order to form such a circuit pattern. A typical process of this method is shown in FIG. 15 and FIG. 16. As shown in FIG. 15 and FIG. 16, a thin film for forming a circuit pattern is entirely or partly deposited on a substrate, followed by applying a resist and drying the applied resist to form a mask layer in this method. By exposing and developing the mask layer through a mask, a pattern reverse to a circuit pattern (reverse circuit pattern) is formed. After that, a desired pattern is formed through etching and removing of the mask layer in this method. This method is excellent in having mass productivity since the forming precision of a pattern is excellent and since it is possible not only to reproduce the same pattern many times but also to form a plurality of electronic circuits on a single substrate.

However, in this method using a photolithography etching process, many steps are repeated to complete the circuit pattern of an electronic circuit as shown in FIG. 15 and FIG. 16. In the method shown in FIG. 15 and FIG. 16, after a metal thin film 51 is formed on a substrate 50, a mask layer 52 is formed, the mask layer 52 are subjected to exposure, developing treatment, etching and removal, and an insulating layer 53 is formed, followed by forming, exposing, developing, etching and removing a mask layer 54.

In other words, this method needs to have steps as many as about 22 steps comprising film deposition, resist application, drying, exposure, development, etching, removal of a mask layer and the like whenever a circuit pattern comprising a metal thin film and an insulating layer is formed. For this reason, this method has caused a problem in that the production cost is quite high. Further, this method needs to use a large amount of developer, a chemical liquid, such as an etching agent, and a cleaning liquid when such many processes are performed. This has caused problems in that not only the production cost is quite high because of low yield but also the environmental burden, such as liquid waste disposal, which has been recently a matter of serious concern, is quite high.

From this point of view, in order to solve these problems, as the method for shortening the process comprising many steps, there have been performed a method wherein a circuit pattern is directly formed by using, e.g., a metal mask when depositing a material for the circuit pattern, and a method called lift-off wherein before depositing a material for a circuit pattern, a reverse circuit pattern is formed by a mask layer, followed by forming a thin film for the circuit pattern and removing an unnecessary portion of the thin film along with the mask layer.

However, the above-mentioned method using a metal mask has caused a problem in that since a metal mask lifts from a substrate to make a minute gap between the substrate and the metal mask, a material for a circuit pattern soaks into the gap on deposition of a thin film, causing a limitation to improvement in the formation precision of a pattern. Since the adhesion of the metal mask to the substrate is not good, this problem is significant particularly when forming a long continuous pattern. Specifically, the forming precision of the pattern is lowered since the gap increases as the distance from an edge portion of the substrate increases. Accordingly, the lifting of the metal mask contributes to the soaking of the pattern material. Particularly when there is a pattern adjacent a desired continuous pattern, the lifting of the metal mask causes connection of thin films between both patterns. In order to solve this problem, there has been proposed a method wherein a metal mask is brought into contact with a substrate by forming the metal mask from a magnetic material and disposing a magnet on a surface of the substrate remote from the metal mask (see, e.g., Patent Document 1).

The above-mentioned Patent Document 1 shows a method for forming a pattern, which is applied to a method for fabricating an organic electroluminescent display as shown in FIG. 17 through FIG. 19. In Patent Document 1, each of electrode materials is sputtered by using a metal mask 55 and disposing a magnetized member 57 on a surface of a substrate 56 remote from the metal mask 55 as shown in FIG. 17 through FIG. 19. By this arrangement, electrodes, which comprise combinations of a striped organic layer 59 and a striped cathode 60 crossing over anodes 58 in a matrix pattern, are sequentially deposited. This document describes that the magnetized member 57 is formed so as to make the distance between magnetic lines of force as narrow as possible, being capable of coping with the deviation of a pattern and the soaking of a pattern material caused by lift of the metal mask 55, which cause trouble when using the metal mask 55.

With regard to the above-mentioned method called lift-off, there have been many proposals (see, e.g., Patent Documents 2 to 12). Each of Patent Documents 2 to 5 stated above has disclosed a method for forming a mask layer in an inverted tapered shape, which is appropriate for a lift-off method. The above-mentioned Patent Document 6 has disclosed a method for providing thermostability to a resist so as to be capable of withstanding a temperature applied in a subsequent process. Patent Documents 7 and 8 have disclosed other lift-off methods for various kinds of applications.

In general, the above-mentioned lift-off method is a method wherein a mask layer is formed in a reverse circuit pattern on a substrate, a metal thin film is deposited on the entire surface of the substrate, and the mask layer is removed to form a circuit pattern comprising the metal thin film in openings of the mask layer. FIG. 20 and FIG. 21 show a process for forming a mask layer in a reverse circuit pattern by subjecting the mask layer to exposure, development and the like. These figures show a wet lift-off method, which is performed under a so-called wet condition.

In the method shown in FIG. 20 and FIG. 21, a mask layer 62 is formed on a substrate 61, and the mask layer is exposed and developed to form a resist pattern. After that, a metal thin film 63 is formed, followed by removing the unnecessary mask layer 62 and an unnecessary portion of the metal thin film 63. Further, another mask layer 64 is formed on the substrate 61 and is exposed and developed to form a resist pattern, and an insulating layer 65 is formed, followed by removing the unnecessary mask layer 64 and an unnecessary portion of the insulating layer 65.

When a circuit pattern comprising a metal thin film is formed by a lift-off method, it is preferred that portions of the metal thin film formed in openings of the mask layer and portions of the metal thin film formed on the mask layer be not substantially short-circuited. For this reason, the openings of the mask layer are formed in an inverted tapered shape or an overhang shape. Methods for forming a mask layer in an inverted tapered shape or an overhang shape have also been proposed (see, e.g., Patent Documents 9 to 11).

Patent Document 1: JP-A-2002-75639
Patent Document 2: Japanese Patent No. 2989064
Patent Document 3: Japanese Patent No. 3028094
Patent Document 4: JP-A-7-168368
Patent Document 5: JP-A-8-315981
Patent Document 6: JP-A-11-317418
Patent Document 7: JP-A-2002-134004
Patent Document 8: JP-A-11-339574
Patent Document 9: JP-A-56-81954
Patent Document 10: JP-A-1-236658
Patent Document 11: JP-A-7-29846
Patent Document 12: JP-A-2003-287905
Patent Document 13: JP-A-6-13356
Patent Document 14: JP-A-10-20509

SUMMARY OF THE INVENTION

Problem to be Solved by the Invention

However, the method described in the above-mentioned Patent Document 1 needs to form many quite thin striped slits in a metal mask so as to correspond to striped anodes and striped cathodes. In terms of both making an electronic circuit larger and making a circuit pattern finer, there is an inevitable limitation to the formation of a circuit pattern having good precision by using a magnet to hold such a metal mask. Accordingly, there is a problem that it is impossible to make an electronic circuit larger and finer as desired.

The above-mentioned Patent Documents 2 to 8 are all related to a method using a resist, wherein although the forming precision of a circuit pattern is relatively good, the process time is long because of forming a mask layer in a reverse circuit pattern by photolithography, and wherein a developer and a removing liquid need to be used in a large amount when forming the reverse circuit pattern and removing the mask layer. For this reason, the above-mentioned problem has not been solved yet since a reduction in a required process time and a decrease in environmental burden in terms of disposal of waste materials and liquid waste are insufficient.

Further, the methods described in the above-mentioned Patent Documents 9 to 11 have problems in that since the methods are directed to a wet process, it is impossible to form an inverted tapered shape required for lift-off and it is difficult to reliably remove a mask layer when the methods are applied to a dry process.

On the other hand, there has been proposed a technique wherein the above-mentioned lift-off method is not performed under a wet condition (see, e.g., Patent Documents 13 and 14).

Patent Document 13 discloses "a method for forming a thin-film pattern, comprising forming a stencil on a surface of a substrate by patterning; followed by depositing, on the stencil, a thin film to deposit, irradiating an energy beam from a rear surface of the substrate to remove the stencil, thereby patterning the thin film" for the purpose of making a thin-film pattern fine, and shortening and simplifying a process time by reliably performing patterning without using a wet process.

Patent Document 14 discloses "a method for fabricating a liquid crystal display panel, wherein a resist film, which is constituted from a polymeric material having a urethane bond and/or a urea bond, is applied on a glass substrate having a multilayer film deposited thereon, a metal film, a dielectric insulating film, a semiconductor thin film or a portion of the thin film for constituting a liquid crystal display panel being formed in a patterned shape in the multilayer film; an excimer laser beam is irradiated through a mask having a certain opening pattern, to remove an irradiated portion of the resist film by an ablation phenomenon and to form a patterned resist film with portions of the thin film exposed so as to correspond to the opening pattern of the mask; and the exposed portions of the thin film exposed from the patterned resist film are removed by etching, followed by irradiating an excimer laser beam to remove the remaining resist film by an ablation phenomenon" for the purpose of performing development of the resist film, removal of a remaining resist, and processing of the metal thin film, the semiconductor thin film or the insulating thin film by a complete dry process.

It has been found that the methods described in the above-mentioned Patent Documents 13 and 14 have a problem in that it is difficult to reliably remove only a resist layer (resist film and stencil), without causing damage to a thin film (metal film) to be left on a substrate, by using only an energy beam (excimer laser beam).

The present invention is proposed in consideration of the above-mentioned problems. It is an object of the present invention to provide a method for forming a continuous thin-film circuit pattern with good precision, at low cost and with low environmental burden; an electronic circuit fabricated by the same; and an electronic device including the same.

Means for Solving the Problem

The inventors have devoted themselves to investigate how to achieve the object. As a result, the inventors have found that it is possible to reliably remove only an unnecessary mask layer, without causing damage to a thin-film layer to be left on a substrate, by forming the mask layer, the substrate and the thin-film layer so as to have a certain relationship in terms of absorption coefficient with respect to a laser beam, and the inventors have attained a method for forming a continuous thin-film layer pattern with good precision, at low cost and with low environmental burden.

In order to attain the above-mentioned object, the present invention provides a method for forming a pattern, which is characterized by comprising a mask layer forming step for forming a mask layer on a substrate; an opening forming step for forming an opening in the mask layer; a thin-film layer forming step for forming a thin-film layer on the substrate and on the mask layer; and a removing step for removing, from the substrate, the mask layer and/or a portion of the thin-film layer formed on the mask layer; wherein the opening forming step is performed under a dry condition.

It is preferred that the opening be formed by irradiating a first laser beam to the mask layer. It is preferred the opening be formed by irradiating a first laser beam to the mask layer from a side of the substrate.

It is preferred that the mask layer have a higher absorption coefficient than the substrate and the thin-film layer with respect to the first laser beam. It is preferred that the first laser beam comprise a laser beam having a wavelength of 500 to 1,500 nm and an energy density of 0.1 to 5 J/cm$^2$. It is preferred that the mask layer have an absorption coefficient two times or above that of the substrate and the thin-film layer with respect to the first laser beam. It is preferred that the mask layer have an absorption coefficient of 70% or above with respect to the first laser beam.

It is preferred that the removing step be performed under a dry condition. It is preferred that the mask layer and/or the portion of the thin-film layer formed on the mask layer be removed by being bonded to an adhesive member or by being depressurized and sucked in the removing step. It is preferred that the mask layer and/or the portion of the thin-film layer formed on the mask layer be removed by irradiation of a second laser beam in the removing step. It is preferred that the mask layer have a higher absorption coefficient than the substrate and the thin-film layer with respect to the second laser beam. It is preferred that the second laser beam comprise a laser beam having a wavelength of 500 to 1,500 nm and an energy density of 0.1 to 5 J/cm$^2$.

It is preferred that the mask layer have an absorption coefficient two times or above that of the substrate and the thin-film layer with respect to the second laser beam. It is preferred that the mask layer have an absorption coefficient of 70% or above with respect to the second laser beam. It is preferred that the mask layer comprise a material containing black pigment or black dye in an amount of 10 to 99 mass %. It is preferred that the mask layer be formed by applying a liquid resist on the substrate or by laminating a resist film on the substrate. It is preferred that the mask layer be formed under a reduced pressure. It is preferred that the mask layer comprise at least one selected from the group consisting of an epoxy compound, a polyethylene compound, a polyimide compound, and a tetrafluoroethylene compound.

It is preferred that the method further comprise an adhesive force reducing step for reducing an adhesive force between the substrate and the mask layer, before the removing step. It is preferred that the mask layer be subjected to irradiation of light and/or heat in the adhesive force reducing step. It is preferred that the thin-film layer be formed so as to expose an edge portion of the mask layer. It is preferred that the thin-film layer be formed in the presence of a gas or under a reduced pressure. It is preferred that the thin-film layer be formed by a sputtering method. It is preferred that the thin-film layer comprise at least one selected among metal, glass and ceramics. It is preferred that the thin-film layer comprise at least one selected from the group consisting of Cr, Cu, Au, Al, Ti, Ni, W and a compound thereof, and the group consisting of $SiO_2$, SiN, $Bi_2O_3$, PbO, $In_2O_3$, $SnO_2$, SiC, ZnO, $Al_2O_3$, $TiO_2$, $Ta_2O_5$, $Sb_2O_3$ and a mixture thereof. It is preferred that the method further comprise forming a second thin-film layer on the substrate and removing a portion of the second thin-film layer by irradiating a third laser beam to the second thin-film layer, before the mask layer forming step or after the removing step.

The present invention also provides a method for forming a pattern, which is characterized by comprising a mask layer forming step for forming a mask layer on a substrate; an opening forming step for forming an opening in the mask layer by irradiation of a first laser beam; a thin-film layer forming step for forming a thin-film layer on the substrate and on the mask layer; and a removing step for removing the mask layer from the substrate by irradiation of a second laser beam; the mask layer having a higher absorption coefficient than the substrate and the thin-film layer with respect to the first and second laser beams. It is preferred that the thin-film layer be formed by a sputtering method. It is preferred that the mask layer comprise a material containing black pigment or black dye in an amount of 10 to 99 mass %. It is preferred that each of the first and second laser beams comprise a laser beam having a wavelength of 500 to 1,500 nm and an energy density of 0.1 to 5 J/cm$^2$. It is preferred that each of the first and second laser beams comprise a laser beam having a wavelength of 500 to 1,500 nm and an energy density of 0.1 to 1 J/cm$^2$.

In order to attain the above-mentioned object, the present invention also provides an electronic circuit, which is characterized to be fabricated by using the method for forming a pattern, defined in any one of the above-mentioned modes. In order to attain the above-mentioned object, the present invention also provides an electronic device, which is characterized by including the electronic circuit defined in any one of the above-mentioned modes.

EFFECTS OF THE INVENTION

The pattern forming method according to the present invention can reduce the cost and the environmental burden since the opening forming step is performed under a dry condition as explained. Heretofore, exposure, development and the like have been performed under a wet condition in order to form an opening. However, the pattern forming method according to present invention can form an opening without exposure or development and can significantly reduce the number of the steps since the method is performed under a dry condition. For example, when the method uses a material that can be patterned by being directly removed under a dry condition, direct patterning by a laser beam can be combined to form a pattern more effectively. As a result, the throughput is improved by a significant reduction in the number of the steps, and the facility investment and the cost for indirect materials, such as a chemical liquid, can be significantly reduced by the improved throughput. Accordingly, the present invention has an advantage of being capable of forming a pattern at low cost by a significant reduction in manufacturing cost. Further, it is expected to remarkably improve the yield since it is possible to significantly reduce the number of the steps.

Heretofore, a chemical liquid, such as a developer or a cleaning agent, has been used to perform exposure, development and the like under a wet condition. However, the method according to the present invention is performed under a dry condition without using such a chemical liquid. Accordingly, the present invention is also applicable to a material that has been difficult to form a pattern under a conventional wet condition. Further, the present invention also has advantages of being capable of not only avoiding the generation of liquid waste caused by use of a chemical liquid but also performing the method with low environmental burden.

The present invention also has an advantage of improving reliability since it is possible to restrain an edge portion of a pattern from being exposed, which has been difficult to be done by conventional etching.

In the above-mentioned pattern forming method, the above-mentioned opening can be formed by a single step since the above-mentioned opening is formed by irradiating the first laser beam to the mask layer. As a result, the present invention has an advantage of being capable of significantly reducing the number of the steps.

The above-mentioned pattern forming method can further reduce the cost and the environmental burden since the removing step is performed under a dry condition. Although heretofore, a chemical liquid has been used even to remove a mask layer, the present invention does not need to use a chemical liquid since the method is performed under a dry condition. Accordingly, the present invention has an advantage of being capable of performing the method at lower cost and with lower environmental burden.

The above-mentioned pattern forming method has an advantage of being capable of more easily removing the mask layer since the adhesive force reducing step is contained to reduce the adhesive force between the substrate and the mask layer before the removing step. Further, the above-mentioned pattern forming method can easily reduce the adhesive force since light is irradiated to the mask layer or the mask layer is heated in the adhesive force reducing step. In other words, the present invention has advantages of being capable of not only reducing the adhesive force by a simpler way but also performing the removal more easily.

The above-mentioned pattern forming method has an advantage of being capable of removing the mask layer more easily since the mask layer and/or a portion of the thin film formed on the mask layer is removed by use of an adhesive member capable of being bonded to the mask layer and/or the portion of the thin film or is removed by being depressurized and sucked in the removing step.

In the above-mentioned pattern forming method, the thin-film layer is formed so as to expose an edge portion of the mask layer. When an adhesive member is used to perform the removal in the removing step for instance, the pattern forming method has advantages of facilitating bonding between the adhesive member and the mask layer and reliably removing the mask layer and the portion of the thin-film layer formed on the mask layer.

The above-mentioned pattern forming method has an advantage of simply and easily forming the mask layer since the above-mentioned mask layer is formed by applying a liquid resist on the substrate or by laminating a resist film on the substrate. The above-mentioned pattern forming method has an advantage of forming a continuous thin mask layer appropriate for formation of a fine pattern since the mask layer is formed under a reduced pressure.

The above-mentioned pattern forming method has an advantage of simply and easily forming a thin-film layer since the thin-film layer is formed in the presence of a gas or under a reduced pressure in the thin-film layer forming step.

The above-mentioned pattern forming method has an advantage of forming the above-mentioned thin-film layer from a desired material since the thin-film layer comprises at least one selected among metal, glass and ceramics. In the above-mentioned pattern forming method, the above-mentioned thin-film comprises at least one selected from the group consisting of Cr, Cu, Au, Al, Ti, Ni, W and a compound thereof, and the group consisting of $SiO_2$, SiN, $Bi_2O_3$, PbO, $In_2O_3$, $SnO_2$, SiC, ZnO, $Al_2O_3$, $TiO_2$, $Ta_2O_5$, $Sb_2O_3$ and a mixture thereof. Further, the above-mentioned mask layer comprises at least one selected from the group consisting of an epoxy compound, a polyethylene compound, a polyimide compound, and a tetrafluoroethylene compound.

In a case where the above-mentioned pattern forming method further comprises forming a second thin-film layer on the substrate and removing a portion of the second thin-film layer by irradiating a third laser beam to the second thin-film layer, before the mask layer forming step or after the removing step, even when a plurality of thin-film layers are formed, the pattern forming method has an advantage of effectively forming a pattern by using a material, such as $In_2O_3$, $SnO_2$ or another oxide, or Cr, Ti, or another metal, which can be removed by irradiation of a laser beam.

In the pattern forming method according to the present invention, when the mask layer, the substrate and the thin-film layer have a certain relationship in terms of absorption coefficient with respect to the first laser beam and/or the second laser beam, only the laser beam or laser beams can be used to easily and reliably remove only the unnecessary mask layer without causing any damage to a portion of a thin-film layer to be left on the substrate. Accordingly, the pattern forming method can realize a continuous thin-film circuit pattern at low cost, with low environmental burden and with good precision.

In the pattern forming method according to the present invention, it is preferred that the mask layer comprise an organic material. In this mode, the pattern forming method has an advantage of removing the mask layer with a lower amount of energy.

In the pattern forming method according to the present invention, it is preferred that the mask layer comprise an inorganic material. In this mode, the pattern forming method has an advantage of obtaining a finer pattern since the mask layer can be formed as a thin film.

In the pattern forming method according to the present invention, it is preferred that the mask layer comprise a material containing black pigment or black dye in an amount of 10 to 99 mass %. In this mode, the pattern forming method has an advantage of being capable of performing the pattern formation (the formation of an opening) and the removal in a sufficient way even by a laser beam having a low energy density since the absorption coefficient of the mask layer with respect to the laser beam is increased.

In the pattern forming method according to the present invention, it is preferred that the first laser beam and/or the second beam comprise a laser beam having a wavelength of 500 to 1,500 nm and an energy density of 0.1 to 5 $J/cm^2$. In this mode, the pattern forming method has an advantage of being capable of easily differentiating the mask layer from the substrate in terms of absorption coefficient with respect to the laser beam.

In the pattern forming method according to the present invention, it is preferred that the mask layer have an absorption coefficient two times or above that of the substrate and the thin-film layer with respect to the first laser beam and/or the second laser beam. In this mode, the pattern forming method has an advantage of being capable of more easily and more reliably removing only the unnecessary mask layer in the removing step.

In the pattern forming method according to the present invention, it is preferred that the mask layer have an absorption coefficient of 70% or above with respect to the first laser beam and/or the second laser beam. In this mode, the pattern forming method has an advantage of being capable of selectively removing the unnecessary mask layer.

In the pattern forming method according to the present invention, it is preferred that the first laser beam be irradiated to the mask layer by a certain way, specifically, the opening is formed in the mask layer by irradiating the first laser beam to the mask layer from a side of the substrate without the mask layer formed thereon. By this arrangement, the thin-film layer can be easily formed so as to expose an edge portion of the mask layer after formation of openings since at least one portion of the openings of the mask layer is formed in a reverse tapered shape. When the thin-film layer is formed so as to expose an edge portion of the mask layer, the pattern forming method has an advantage of being capable of more reliably removing only the unnecessary mask layer in the removing step.

The electronic circuit according to the present invention has an advantage of being capable of being fabricated at low cost and with low environmental burden since the electronic circuit is fabricated by using any one mode of the pattern forming method as explained. Further, the electronic device according to the present invention has an advantage of being capable of being fabricated at low cost and with low environmental burden since the electronic circuit includes the electronic circuit defined in any one mode of the pattern forming method as explained.

BRIEF DESCRIPTION OF THE DRAWINGS

FIG. 1 shows a portion of the process for forming a pattern, according to an embodiment of the present invention, wherein

FIG. 2 shows a subsequent portion of the process shown in FIG. 1, wherein

FIG. 3 shows a process for forming an opening pattern in a mask layer, according to the embodiment of the present invention, wherein

FIG. 4 shows another process for forming an opening pattern in a mask layer, according to the embodiment of the present invention, wherein

FIG. 5 shows another process for forming an opening pattern in a mask layer, according to the embodiment of the present invention, wherein

FIG. 9 shows a portion of the process for forming the thin-film circuit pattern in Example 1 of the present invention, wherein

FIG. 10 shows a subsequent portion of the process shown in FIG. 9, wherein

FIG. 15 shows a portion of a conventional process for forming a thin-film circuit pattern, wherein

FIG. 16 shows a subsequent portion of the conventional process shown in FIG. 15, wherein

FIG. 20 shows a portion of a conventional process for forming a thin-film circuit pattern, wherein FIG. 21 shows a subsequent portion of the conventional process shown in FIG. 20, wherein

Figure 1A:
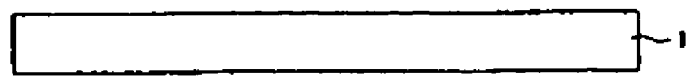
FIGS. 1(a) to (d) are cross-sectional views showing a schematic structure of an electronic circuit.
Figure 1B:
Figure 1C:
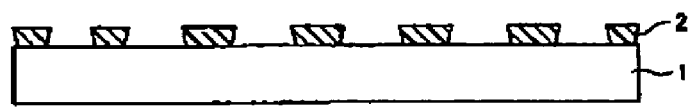
Figure 1D:

EXPLANATION OF REFERENCE NUMERALS 1 substrate
2 and 4 mask layer
3 thin film (thin-film layer)
5 insulating layer
6 glass substrate (substrate)
9 electrode (thin-film layer)
10 wiring pattern (thin-film layer)
13 resist film (mask layer)
17 metal thin-film layer (thin-film layer)
20 glass substrate (substrate)
22 transparent electrode (thin-film layer)
23 bus electrode (thin-film layer)

BEST MODE FOR CARRYING OUT THE INVENTION

An embodiment of the present invention will be described as below, based on FIG. 1 through FIG. 5. The method for forming a pattern, according to this embodiment of the present invention is a method for forming, e.g., a circuit pattern by combining a method for forming a pattern by use of a resist in a dry process and a method for mechanically removing the resist. Specifically, the method for forming a pattern, according to the present invention is a method which comprises forming, in a mask layer formed on a substrate, an opening pattern (openings) under a dry condition, followed by depositing (forming) a thin film (thin-film layer) to form a circuit pattern on the substrate and the mask layer and then removing a portion of the thin film unnecessary for the circuit pattern, or a so-called unnecessary portion of the thin film, along with the mask layer.

More specifically, a mask layer is entirely formed on a surface of a substrate before depositing a material for forming a pattern on the substrate (pattern forming material). Then, the mask pattern is processed under a dry condition to form an opening pattern substantially conforming to a desired pattern. After that, a thin film, which comprises such a pattern forming material, is entirely deposited on the substrate and the mask layer. In this method, a portion of the pattern forming material, which is unnecessary for formation of the pattern, is mechanically removed along with the mask layer from the substrate to finally form the desired pattern comprising the thin film.

The dry condition is opposite to a wet condition using a developer, a cleaning liquid or the like, which has been performed as a method for forming a pattern. In the dry condition, a pattern is formed without using such a developer, such a cleaning liquid or the like.

Now, a pattern forming method according to the present invention will be described in detail, referring to FIG. 1 and FIG. 2. FIG. 1 and FIG. 2 show a process for forming a circuit pattern by the pattern forming method according to the present invention. First, a resist is applied on a substrate 1 to form a mask layer 2 (FIG. 1(a) and (b), called the mask layer forming step). The resist may comprise a material that allows the resist to be processed under a dry condition when forming an opening pattern (resist pattern) described later. Next, the mask is processed under such a dry condition to form an opening pattern substantially conforming to a circuit pattern (FIG. 1(c), called the opening forming step). And, a thin film 3 is deposited for forming the circuit pattern (FIG. 1(d), called the thin-film layer forming step).

Examples of the method for processing the mask layer 2 to form the opening pattern by the above-mentioned dry condition include a method for irradiating the mask layer 2 with a first laser beam to form the opening pattern and a method for forming the opening pattern by use of a dry etchant. An example of the method for forming the opening pattern by use of a first laser beam is a method for using an excimer laser beam, a YAG laser beam or the like as the first laser beam to evaporate and remove the mask layer 2 by a combination of ablation and thermal energy. In this case, it is possible to perform the processing in an extremely effective way since the mask layer can be directly removed at the time of exposure without performing all of exposure, development and cleaning. An example of the method for forming the opening pattern by use of a dry etchant is a method for performing the processing by using, e.g., oxygen plasma as the dry etchant to perform the removal by a chemical reaction.

However, when the mask layer 2 is processed by use of a first laser beam, the energy of the first laser beam is generally attenuated as the first laser beam coming into from a surface progresses into the inside of the mask layer 2. For this reason, each of the openings of the opening pattern is formed in a conical shape having a widely opened top, or a so-called forward tapered shape in cross-section. In this case, a thin film, which will be formed in a subsequent step, is finally formed in such a state that a portion of the thin film formed on the substrate 1 and a portion of the thin film formed on the mask layer 2 are continuous. Accordingly, it is impossible to remove the mask 2 so as to obtain a desired circuit pattern, or there is a possibility that the portion of the thin film formed on the substrate 1 is also removed when removing the mask layer 2.

From this point of view, it is necessary to form each of the openings of the opening pattern of the mask layer 2 in a reverse tapered shape or an overhang shape in cross-section in order to mechanically remove the mask layer 2. The reverse tapered shape is a shape wherein the size of the openings of the mask layer 2 gradually increases toward the substrate 1. The overhang shape means a state wherein when opening patterns are formed by forming, e.g., two mask patterns, the size of the openings of the upper opening pattern is smaller than that of the openings of the lower opening pattern. In other words, it is meant that edges of the openings of the upper opening pattern stick out in comparison with edges of the openings of the lower opening pattern.

Figure 5A:
FIGS. 5(a) to (c) are cross-sectional views showing a schematic structure of an electronic circuit.
Figure 5B:
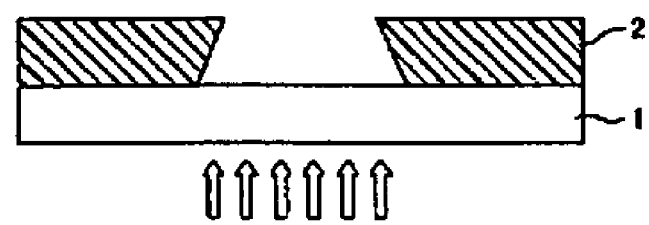
Figure 5C:
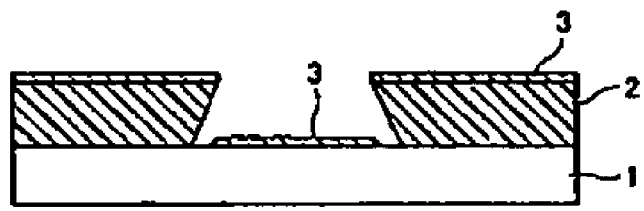

Specifically, the processing of the mask layer 2 in the mask pattern forming method according to the present invention is performed under a dry condition so that each of the openings of the opening pattern comprising the mask layer 2 is formed in a reverse tapered shape or an overhang shape in cross-section. Now, the method for forming the opening pattern by processing the mask layer by use of the first laser beam will be specifically described. FIG. 3 to FIG. 5 show a process wherein the mask layer 2 formed on the substrate 1 is processed so as to be formed in a reverse tapered shape or an overhang shape in cross-section.

Figure 3A:
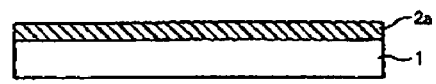
FIGS. 3(a) to (e) are cross-sectional views showing a schematic structure of an electronic circuit.
Figure 3B:
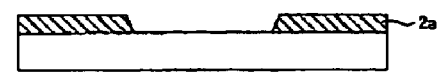
Figure 3C:
Figure 3D:
Figure 3E:
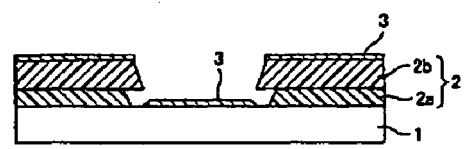
Figure 4A:
FIGS. 4(a) to (d) are cross-sectional views showing a schematic structure of an electronic circuit.
Figure 4B:
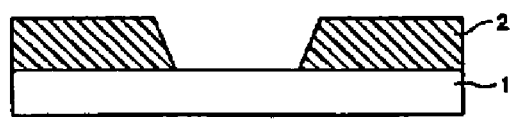
Figure 4C:
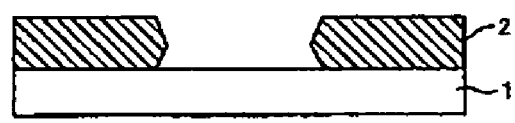
Figure 4D:
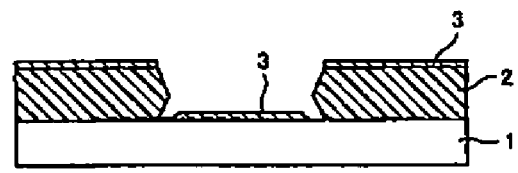

First, the process shown in FIG. 3 will be described. A liquid resist is applied or a film resist is laminated on the substrate 1 to form a mask layer 2a as a first layer (FIG. 3(a)). And, the first laser beam is irradiated from the side of the mask layer 2a to form an opening pattern (FIG. 3(b)). The opening pattern is formed so as to be gradually narrowed toward the surface of the substrate 1, in other words in a so-called forward tapered shape in cross-section. Next, a film resist is laminated on the mask layer 2a as the first layer to form another mask layer 2b as a second layer (FIG. 3(c)). And, the first laser beam is irradiated from the side of the mask layer 2b to form an opening pattern (FIG. 3(d)). The opening pattern of the mask layer 2b as the second layer is formed so that the size of an opening formed in the mask layer 2b is smaller that that of an opening formed in the mask layer 2a as the first layer. By this treatment, as shown in FIG. 3(d), edges of the opening formed in the mask layer 2b as the second mask stick out in comparison with edges of the opening formed in the mask 2a as the first mask, thereby being capable of forming the opening pattern in an overhang shape. Then, the thin film 3 for forming the circuit pattern is deposited (FIG. 1(d) and FIG. 3(e)).

The method for processing the mask layer in a reverse tapered shape or an overhang shape under a dry condition may be performed by a method for irradiating the first laser beam twice with the focus of the first laser beam modified, as an alternative to the method for forming the two mask layers stated above. The process in this alternative method is shown in FIG. 4, and the process will be described in detail. First, a liquid resist is applied or a film resist is laminated on the substrate 1 to form the mask layer 2 (FIG. 4(a)). And, the first laser beam is irradiated from the side of the mask layer 2 to process the mask layer 2 in a forward tapered shape (FIG. 4(b)). After that, the first laser beam is irradiated again, having the focus shifted toward the side of the substrate. By this treatment, an opening formed in the opening pattern comprising the mask layer 2 is modified into a shape starting with a forward tapered shape and terminating with a reverse tapered shape in cross-section (FIG. 4(c)). The reason is that since the opening pattern has been processed in such a forward tapered shape by the first irradiation of the laser beam, a corresponding portion of the resist that absorbs the energy of the laser beam does not remain when the second irradiation of the laser beam is performed, with the result that the energy is applied to lateral portions of the resist in the opening in the vicinity of the focus close to the surface of the substrate 1. Then, the thin film 3 for forming the circuit pattern is deposited (FIG. 1(d) and FIG. 4(d)).

From this point of view, e.g., when a thin film comprising an inorganic material that prevents the first laser beam from passing therethrough (thin-film layer capable of preventing a laser beam from passing therethrough), in particular when a reflective thin-film material (reflective thin film) is disposed between the substrate 1 and the mask layer 2, the above-mentioned principle can be effectively utilized. In other words, in a case where such a thin-film layer capable of preventing a laser beam from passing therethrough is disposed between the substrate 1 and the mask 2, when the focus position of the first laser beam is preliminarily shifted toward the side of the substrate 1, the irradiated first laser beam can give energy to lateral portions of the resist in the opening at a portion of the mask 2 close to the substrate by the thin-film layer capable of preventing a laser beam from passing therethrough. Further, in a case where such a reflective thin film is disposed, the mask layer 2 can be further processed by a reflective effect, with the result that the mask layer 2 is processed so as to further spread the base of the opening. As a result, the opening pattern can be processed so as to form the opening in a reverse tapered shape or a shape starting with a forward tapered shape and terminating with a reverse tapered shape in cross-section by irradiating the first laser beam only once.

The method for processing the mask layer in a reverse tapered shape or an overhang shape under a dry condition may be also performed by a method for irradiating a laser beam from a different direction, an alternative to the above-mentioned two methods. Specifically, in this method, when the substrate 1 comprises a material capable of transmitting a laser beam therethrough, such as glass, the mask layer 2 is processed to have the opening pattern directly formed in a reverse tapered shape by irradiating the first laser beam from the side of the substrate 1 in such a state that the mask 2 has been formed on the substrate 1. A process for this method is shown in FIG. 5 and will be specifically explained. First, a liquid resist is applied or a film resist is laminated on the substrate 1 to form the mask layer 2 (FIG. 5(*a*)). And, the first laser beam is irradiated from the side of the substrate 1 (the side with the mask layer 2 being formed thereon). By this treatment, the laser beam that has been passed through the substrate 1 can process the mask layer 2 to have the opening pattern formed in a reverse tapered shape in the cross-section of the mask layer 2 (FIG. 5(*b*)). Then, the thin film 3 for forming the circuit pattern is deposited (FIG. 1(*d*) and FIG. 5(*c*)).

When this method is used, it is possible to reliably form the opening pattern in a reverse tapered shape by single irradiation of the laser beam, although the substrate 1 needs to comprise a material capable of transmitting a laser beam therethrough. From this point of view, this method is a method that can form the opening pattern in a reverse tapered shape most effectively. When the mask layer 2 has a large thick, it is possible to form the opening pattern in a reverse tapered shape in a better way by irradiating the first laser beam from the side of the substrate 1 after performing the processing from the side of the mask layer 2 as shown in FIG. 4(*b*).

As explained, whatever material the mask layer 2 comprises, it is possible to process the mask layer 2 so as to have the opening pattern formed in a reverse tapered shape or an overhang shape under a dry condition, in particular using a laser, by any one of the above-mentioned methods or a combination of respective methods.

Next, the mask layer 2 and a portion of the thin film 3 formed on the mask layer 2 are mechanically removed from the substrate. By this treatment, the circuit pattern comprising the thin film is exposed (FIG. 2(*a*), called the removing step). It should be noted that the resist enters into fine irregularities in the surface of the substrate 1 since the resist inherently has a low viscosity. For this reason, the mask layer 2 comes close to several tens of nm (several angstroms) with respect to the substrate 1, creating a chemical adhesive force (such as a van der Waals force or hydrogen bond) or a mechanical adhesive force (such as an anchoring effect). The adhesion property between the mask layer 2 and the substrate 1 depends on such a chemical adhesive force or such a mechanical adhesive force. This means that it is necessary to reduce or lose the adhesion property between the mask layer 2 and the substrate 1 (hereinbelow, simply referred to "reduce the adhesion property") in order to mechanically remove, from the substrate, the mask layer 2 and that portion of the thin film 3 formed on the mask layer 2. In the pattern forming method according to the present invention, the adhesion property between both members is reduced by irradiation of light and/or heat (called the adhesive force reducing step). Now, this step will be specifically explained.

First, a method for reducing the adhesion property by irradiation of light will be described. After the thin film 3 is deposited on the mask layer 2, light is irradiated from the side of the substrate 1. By this treatment, the resist causes photopolymerization reaction, being cured and shrunk. As a result, the adhesion property between the mask layer 2 and the substrate 1 is reduced. In other words, the resist may comprise a material containing a component, which causes photopolymerization reaction by irradiation of light, such as a photosensitive resin, in this method. The irradiated light may comprise light capable of subjecting the resist to photopolymerization reaction, such as an ultraviolet ray, in this method. When using resists comprising different materials, the irradiation of light may be carried out by using rays having wavelengths corresponding to the respective resist materials.

Next, a method for reducing the adhesion property by application of heat will be described. Heating is carried out during or after deposition of the thin film 3 on the mask layer 2. By this treatment, the resist causes photopolymerization reaction, being cured and shrunk. As a result, the adhesion property between the mask layer 2 and the substrate 1 is reduced. In other words, the resist may comprise a material containing a component, which causes photopolymerization reaction by application of heat, in this method. The method by application of heat is particularly effective when the substrate 1 does not transmit light, such as a case where the substrate comprises an opaque material.

The above-mentioned methods by irradiation of light or heat can reduce the adhesion property more effectively by being properly combined so as to make full use of the respective advantages. As the method for increasing the removal property of the mask layer 2, e.g., a method by heating and foaming or a method making use of a phase-transition polymer is applicable, as an alternative to the above-mentioned methods by irradiation of light or heat.

After that, the mask layer 2, which has had the adhesion property reduced, is mechanically removed along with that portion of the thin film formed on the mask layer 2. There is no limitation to the mechanical removal method as long as it is possible to remove the mask layer 2 along with that portion of the thin film 3 formed thereon. Examples of the mechanical removal method include a method for performing the removal by peeling off the mask layer 2 from an edge thereof, a method for performing the removal by use of a member, which adheres to that portion of the thin film 3 formed on the mask layer 2, a method for performing the removal by suction under a reduced pressure, a method for performing the removal by spraying a pressurized gas to blow off the mask layer 2, and a method for performing the removal by brushing. In any one of the above-mentioned methods, it is easy to perform the removal since the adhesion property of the mask layer 2 has been reduced.

Specific examples of the method for performing the removal by peeling off the mask layer 2 from an edge thereof include a method for picking an edge of the mask layer 2 and gradually peeling off the mask layer from the edge, and a method for using, e.g., a roller to stick that portion of the thin film 3 on the mask layer 2 to the roller, followed by rotating the roller to peel off the mask layer 2 along with that portion of the thin film 3. Specific examples of the method for performing the removal by use of a member, which adheres to that portion of the thin film 3 formed on the mask layer 2, include a method for performing the removal by using an adhesive member, such as an adhesive tape, to stick that portion of the thin film 3 to the adhesive tape, and a method for performing the removal by mounting an adhesive tape to a roller, followed by rotating the roller while sticking that portion of the thin film to the adhesive tape.

The method for performing the removal by suction under a reduced pressure is a method wherein the mask layer 2 is removed along with that portion of the thin film 3 on the mask layer by performing decompression after the thin film has been deposited on the thin film. In this case, it is sufficient that decompression is performed to such a degree that the mask layer 2 and that portion of the thin film 3 can be removed. The method for performing the removal by spraying a pressurized gas to blow off the mask layer 2 is a method wherein the mask layer 2 and that portion of the thin film 3 on the mask layer are removed by spraying a gas after the thin film 3 has been deposited on the mask layer 2. In this case, it is sufficient that the gas is sprayed at such a pressure that the mask layer 2 and that portion of the thin film 3 can be removed.

In order to mechanically remove the mask layer 2 and that portion of the thin film 3 formed on the mask layer 2, it is preferred that a region without the thin film 3 deposited therein be formed on the mask layer 2. By forming such a region without the thin film 3 deposited therein, it is possible to easily perform mechanical removal since that portion of the mask layer 2 is exposed. The region without the thin film 3 deposited therein may be located in an edge portion of the mask layer 2 (namely, a portion of the mask layer 2 located on an edge portion of the substrate 1). It is sufficient that that region has such an area that it is possible to easily perform mechanical removal.

Further, the mask layer 2 may be removed by irradiation of a second laser beam. For example, there is a method wherein, e.g., an excimer laser beam or a YAG laser beam is used as the second laser beam, and the mask layer 2 is evaporated and removed by a combination of ablation and thermal energy. In this case, it is possible to perform all of the processing in an extremely effective way since the mask layer can be directly removed at the time of exposure without performing all of exposure, development and cleaning.

By forming the opening pattern of the mask layer 2 under a dry condition, and mechanically removing the mask layer 2 and that portion of the thin film 3 formed on the mask layer 2 as stated above, it is possible not only to significantly decrease the number of the steps but also to perform the pattern forming method without containing a wet condition. Accordingly, it is possible to form a pattern at low cost and with low environmental burden.

Figure 2A:
FIGS. 2(a) to (d) are cross-sectional views showing a schematic structure of the electronic circuit.
Figure 2B:
Figure 2C:
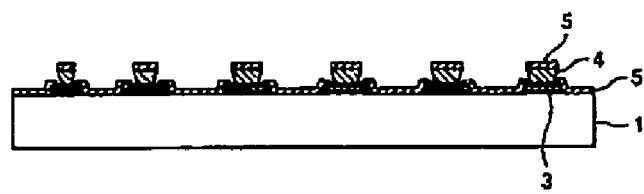
Figure 2D:

After that, another mask layer 4 is formed on the substrate 1 and the thin film 3, and an opening pattern (resist pattern) is formed under a dry condition (FIG. 2(b)). Next, an insulating layer is deposited on the entire surface of the substrate 1 (FIG. 2(c)), and an unnecessary portion of the insulating layer 5 is mechanically removed along with the mask layer 4 (FIG. 2(d)). By this treatment, an electronic circuit, which comprises a circuit pattern of the thin film, is fabricated.

Now, the substrate, the mask layers, the laser beam and the thin film used in the pattern forming method according to the present invention will be described in detail.

<Substrate>

There is no limitation to the above-mentioned substrate as long as the substrate comprises a material, which transmits a laser beam described later (a material having a transmittance of 80% or above in the present invention). A specific preferred example of the substrate is a glass substrate.

When the substrate comprises a material, which transmits a laser beam described later, it is possible to reliably form the opening pattern by a single irradiation of a laser beam in the opening forming step, and it is possible to remove the unnecessary mask layer by irradiating a laser beam from the side of the substrate with the mask layer and the thin-film layer formed thereon, in the removing step.

<Mask Layer>

There is no limitation to the above-mentioned mask layer as long as the mask layer comprises a material, which can be removed by irradiation of a laser beam described later, or causes so-called ablation (hereinbelow, simply called "mask layer forming material"). The mask layer may comprise an organic material or an inorganic material. It should be noted that in the present invention, such a mask layer forming material is not necessarily photosensitive since the formation of an opening pattern is performed under a dry condition using only a laser beam described later.

Specific examples of the organic material include an acrylic resin, an epoxy resin, a polyethylene resin, a polyimide resin, a polyester resin and a tetrafluoroethylene resin.

Examples of the inorganic material include a combination of layers of $Cr/CrO_x$(/substrate side) for irradiation of a laser beam from the side of a substrate and a combination of layers $CrO_x/Cr$(/substrate side) for irradiation of a laser beam from the side of the mask layer remote from a substrate. Another example of the material is a layer of C (carbon). The above-mentioned layer of Cr and the above-mentioned layer of $CrO_x$ may contain a slight amount (10 mass % or below) of N (nitrogen atoms) or C (carbon atoms). Among them, a combination of layers of $Cr/CrO_x$ is preferred since a mask obtained by this combination is excellent in durability and light absorption coefficient.

The mask layer comprise a mask layer forming material containing pigment or dye in an amount of preferably 10 to 99 mass %, more preferably 20 to 99 mass %. It is preferred that the pigment comprise black pigment, and that the dye comprise black dye.

There is no limitation to the black pigment and/or the black dye as long as these materials are a compound capable of increasing the absorption efficiency with respect to a laser beam irradiated to the mask layer. Specific preferred examples include carbon black, titan black, bismuth sulfide, an iron oxide, azo acid dye (such as C. I. Mordant Black 17), disperse dye and cationic dye. Among them, carbon black and titan black are preferred since both of them have a high absorption coefficient with respect to all kinds of laser beams.

When the mask layer contains such black pigment and/or such black dye in an amount of 10 to 99 mass %, the mask layer can increase the absorption coefficient with respect to a laser beam described later. Accordingly, it is possible to sufficiently form a pattern (an opening) and to remove the mask layer even by a laser beam having a low density of energy (e.g. about 0.1 to 1 $J/cm^2$). Thus, it is possible to easily and reliably remove only the unnecessary mask layer without causing any damage to a portion of a thin-film layer to be left on a substrate.

In the pattern forming method according to the present invention, the mask layer, which comprises such a mask layer forming material, is set to have a large absorption coefficient with respect to a laser beam described later than a substrate or a thin-film layer combined with the mask layer, preferably by twice, more preferably by triple, further preferably by five times. Thus, it is possible to have an advantage of being capable of removing only the unnecessary mask layer in an easier and more reliable way in the removing step.

In the pattern forming method according to the present invention, it is preferred from the viewpoint of effective laser processing that the mask layer have an absorption coefficient of 70% or above with respect to a first and/or second laser beam described later.

In the pattern forming method according to the present invention, it is preferred from the viewpoint of formation of an opening by irradiation of a laser beam described later that the mask layer have a film thickness of 5 to 8 μm when comprising an organic material, and 0.01 to 2 μm when comprising an inorganic material.

<Laser Beam>

It is preferred from the viewpoint of effective formation of an opening and of removal of a mask layer without a residue that the first laser beam and the second laser beam have a wavelength of 500 to 1,500 nm and an energy density of preferably 0.1 to 5 J/cm$^2$, more preferably of 0.5 to 3 J/cm$^2$. Specific examples of such a laser beam include a YAG laser beam (having a wavelength of 1,064 nm) and a YAG laser beam (having a wavelength of 532 nm).

When a mask layer comprises a mask layer forming material containing black pigment or black dye in an amount of preferably 10 to 99 mass %, more preferably 20 to 99 mass %, it is preferred to use a laser beam having a wavelength of 500 to 1,500 nm and an energy density of 0.1 to 1 J/cm$^2$. Specific examples of such a laser beam include a YAG laser beam (having a wavelength of 1,064 nm) and a YAG laser beam (having a wavelength of 532 nm).

By using such a laser beam, it is possible to easily and reliably remove only the mask layer without causing any damage to a portion of a thin-film layer to be left on a substrate in the removing step. It should be noted that the first laser beam and the second laser beam may have the same as or be different from each other in terms of wavelength, energy density and the like.

<Thin-Film Layer>

There is no limitation to the thin-film layer as long as the thin-film layer comprises a material, which causes ablation when removing an unnecessary mask layer by irradiation of a laser beam stated above. Specific examples of the material include metal, a semiconductor, and an inorganic material, such as glass or ceramics.

Specifically, it is preferred that when the thin-film layer comprises metal, the metal be at least one selected in the group consisting of Cr, Cu, Au, Ag, Pt, Pd, Sn, Al, Ti, Ni, W and a compound thereof, that when the thin-film layer comprises a semiconductor, the semiconductor be a compound semiconductor comprising a combination of at least two selected among Si, Ge, Al, Ga, As, In, P and Sb, and that when the thin-film layer comprises glass or ceramics, the glass or the ceramics be at least one selected in the group consisting of $SiO_2$, $SiN$, $Bi_2O_3$, $PbO$, $In_2O_3$, $SnO_2$, $SiC$, $ZnO$, $Al_2O_3$, $TiO_2$, $Ta_2O_5$, $Sb_2O_3$ and a mixture thereof.

From the viewpoint of transparency and resistance, and from the viewpoint of being suited to electrodes for a display panel, it is preferred to use Sn-doped $In_2O_3$ (ITO) among them.

In the pattern forming method according to the present invention, the above-mentioned laser beam can be used to form an opening in the above-mentioned mask layer without performing exposure or development and to easily and reliably remove only the mask layer without causing any damage to a portion of the above-mentioned thin-film layer to be left on a substrate. It should be noted that the formation of an opening in the mask layer and the removal of the mask layer by use of the above-mentioned laser beam are caused by evaporation and removal by a combination of ablation and thermal energy brought about by irradiation of the above-mentioned laser beam.

There is no limitation to how to form the thin-film layer. It is preferred that the thin-film layer be formed by a sputtering method, by which the thin-film layer can be easily formed in an opening formed in the mask layer.

An example of the material for the above-mentioned mask layers 2 and 4 is an organic compound, such as a polyethylene compound, a polyimide compound, a polyester compound or a tetrafluoroethylene compound. An example of the material for the above-mentioned insulating layer 5 is an organic compound, such as an epoxy compound, a urethane compound, a polyethylene compound, a polyimide compound, a polyester compound or a tetrafluoroethylene compound. The mask layers 2 and 4 are not necessarily photosensitive since the formation of an opening pattern is performed under a dry condition.

In the pattern forming method according to the present invention, the system for forming a pattern may be accommodated in a sealed and depressurized container (vacuum container) or a sealed container with a gas for CVD (Chemical Vapor Deposition) or the like filled therein. In other words, the deposition of a thin film in the pattern forming method according to the present invention may be performed under a reduced pressure (vacuum) or by chemical vapor deposition.

Although explanation has been made about a case of forming a single thin layer, the present invention is applicable to a case of forming a plurality of thin-film layers. In a case of forming a plurality of thin-film layers, some of the above-mentioned steps may be repeated, or a plurality of thin-film layers may be formed by a method described next. Explanation will be made about a case of using two thin-film layers. In this method, before or after forming the thin film 3 in the above-mentioned steps, a second thin film is formed, and then the second thin film is directly removed by irradiating a laser beam to the second thin film. The second thin film means a thin film that is different from the thin film 3.

Specific explanation will be made. Before the above-mentioned mask layer forming step or before the above-mentioned removing step, the second thin film is formed on a substrate by using a material capable of being directly removed by irradiation of a laser beam. Then, a third laser beam is irradiated to the second thin film to directly pattern a portion of the second thin film so as to obtain a desired pattern. Thus, it is possible to easily form a pattern comprising the second thin film.

When the second thin film is formed after the above-mentioned removing step, a portion of the second thin-film layer formed on a substrate 1 and on the thin film 3, in particular a portion of the second thin-film layer directly formed on the substrate 1 may be directly patterned by irradiation of a laser beam described later.

On the other hand, when the second thin layer is formed before the above-mentioned mask layer forming step, the second thin layer may be directly patterned by irradiation of a laser beam described later before formation of a mask layer for the thin film 3 (namely in such a state that only the second thin-film layer has been formed on the substrate 1) or after formation of the thin film 3 (namely after the thin film 3 on the second thin-film layer has been patterned by the pattern forming method according to the present invention). In a case where the second thin layer is formed before the above-mentioned mask layer forming step, when the second thin-film layer is directly patterned after formation of the thin film 3, it is possible to form a pattern in a more effective way and with a higher precision since a mask layer for formation of the thin film 3 may be formed only on the second thin film before processing (not patterned), not on the substrate 1.

Examples of the third laser beam for directly pattering the second thin-film layer include an excimer laser beam and a YAG laser beam. It is preferred that the third laser beam have a higher energy density than the laser beams (laser beam having a wavelength of 500 to 1,500 nm and an energy density of 0.1 to 5 $J/cm^2$) used for formation of an opening in the mask layer and for removal of the mask layer stated above. Specifically, it is preferred to use a laser beam having a wavelength of 500 to 1,500 nm and an energy density of 3 to 40 $J/cm^2$.

When the second thin film is formed after formation of the thin film 3, the second thin film may be removed by irradiation of the third laser beam after formation of the second thin film. On the other hand, when the second thin film is formed before formation of the thin film 3, the second thin film may be removed by irradiation of the third laser beam before formation of a mask layer for the thin film 3 or after formation of the thin film 3.

Accordingly, it is possible to increase the degree of freedom in the pattern forming method by utilizing a method for directly removing a thin film by a laser beam. In a case where the second thin film 2 is formed before formation of the thin film 3, when the second thin film is removed after formation of the thin film 3, it is possible to form a pattern in a more effective way and with a higher precision since a mask layer for formation of the thin film 3 may be formed only on the second thin film before processing (not patterned), neither on the second thin film nor on the substrate 1.

Examples of the third laser beam for directly pattering the second thin-film layer include an excimer laser beam and a YAG laser beam. The second thin film may comprise a material, which is capable of being directly removed by irradiation of the third laser beam. Examples of the material include an oxide, such as $In_2O_3$ is or $SnO_2$, and metal, such as Cr or Ti. In other words, the material of the second thin film and the laser beam used therefor may be properly selected according to a combination thereof.

As explained, in the pattern forming method according to the present invention, the opening patterns of the mask layers 2 and 4 are formed under a dry condition, and the unnecessary mask layers 2 and 4 are mechanically removed along with an unnecessary portion of the thin film 3 and an unnecessary portion of the insulating layer 5. The process according to the present invention can be combined with formation of the mask layers 2 and 4 by application of dry films or a method for depositing the thin film 3 by vacuum deposition, EB (Electron Beam) deposition, sputtering, CVD or the like, thereby solving the problem presented by the present invention.

Figure 14:
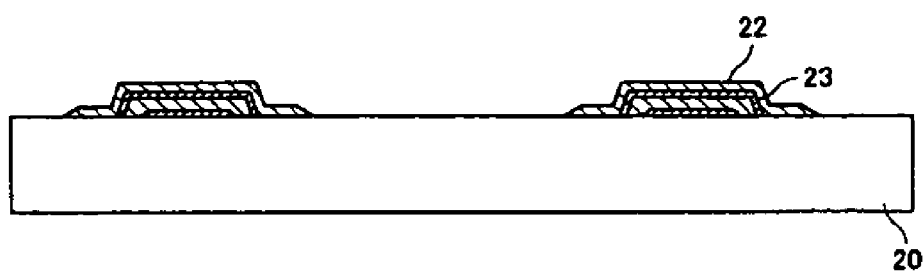
FIG. 14 is a cross-sectional view shown a schematic structure of a thin-film circuit pattern in Example 2 of the present invention.
Figure 15A:
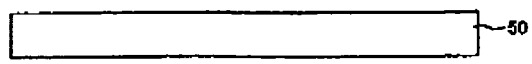
FIGS. 15(a) to (e) are cross-sectional views showing a schematic structure of an electronic circuit.
Figure 15B:
Figure 15C:
Figure 15D:
Figure 15E:
Figure 16A:
FIGS. 16(a) to (e) are cross-sectional views showing a schematic structure of the electronic circuit.
Figure 16B:
Figure 16C:
Figure 16D:
Figure 16E:
Figure 17:
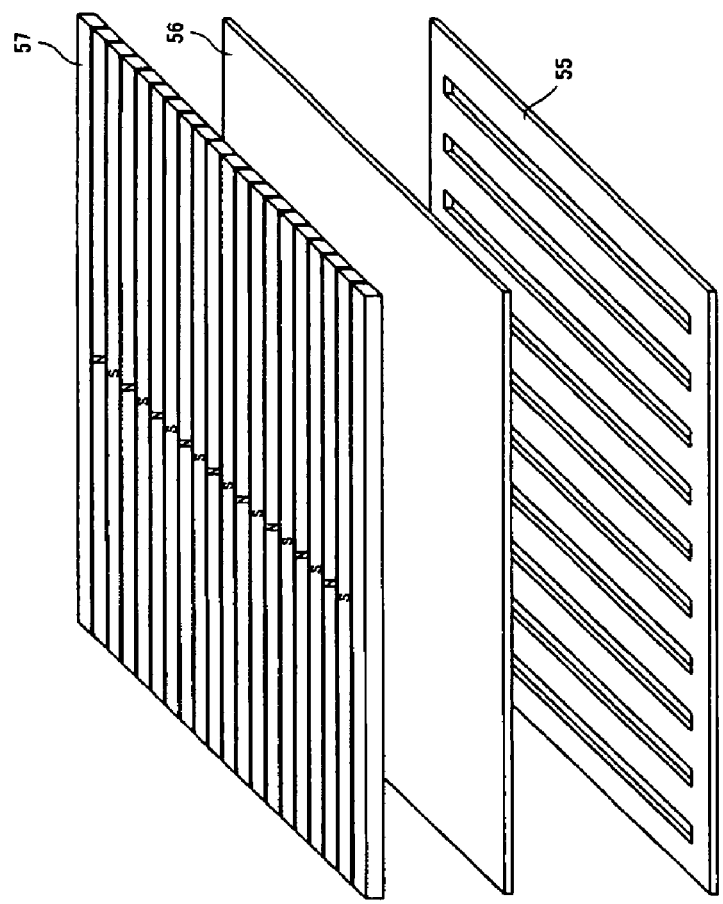
FIG. 17 is a perspective view showing an arrangement of a conventional metal mask and a magnetized member when the metal mask is used to form a thin-film circuit pattern.
Figure 18:
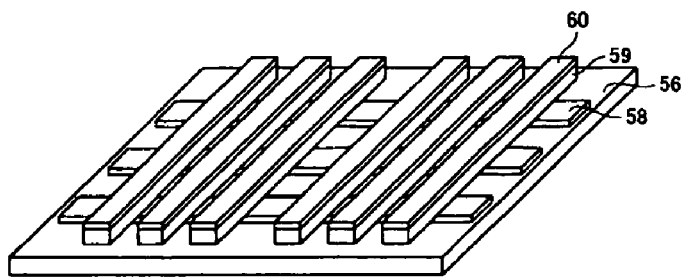
FIG. 18 is a perspective view showing a schematic structure of an electronic circuit, wherein the thin-film circuit pattern has been formed by such a conventional metal mask.
Figure 19:
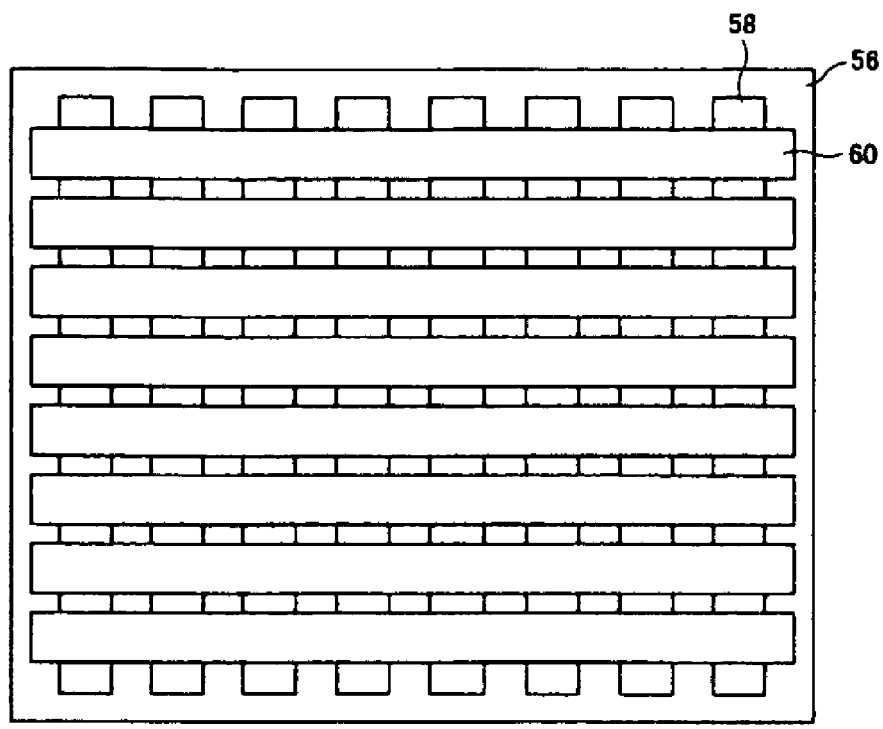
FIG. 19 is a plan view showing a schematic structure of the electronic circuit, wherein the thin-film circuit pattern has been formed by such a conventional metal mask.
Figure 20A:
FIGS. 20(a) to (e) are cross-sectional views showing a schematic structure of an electronic circuit.
Figure 20B:
Figure 20C:
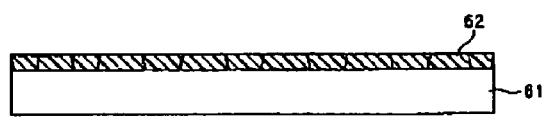
Figure 20D:
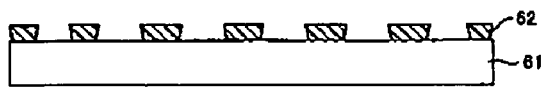
Figure 20E:
Figure 21A:
FIGS. 21(a) to (d) are cross-sectional views showing a schematic structure of the electronic circuit.
Figure 21B:
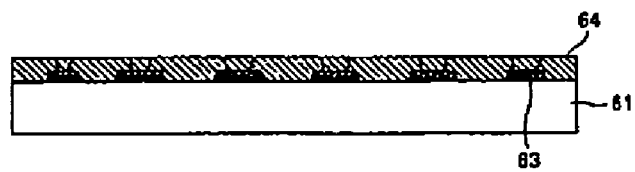
Figure 21C:
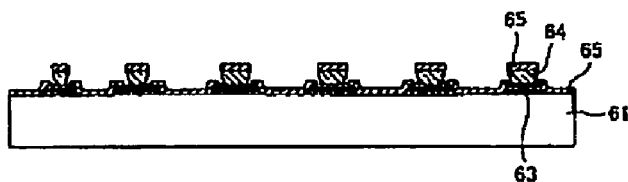
Figure 21D:

The pattern forming method according to the present invention can be called a dry lift-off method since the pattern is formed under a dry condition and since the unnecessary mask layers 2 and 4 are mechanically removed along with an unnecessary portion of the thin film 3 and an unnecessary portion of the insulating layer 5. When FIG. 1 and FIG. 2 showing the process according to the present invention are compared to FIG. 14 and FIG. 15 showing a conventional photolithographic process and FIG. 19 and FIG. 20 showing a conventional wet lift-off process, the pattern forming method according to the present invention can be performed in a number of steps in about 60% of that of the conventional processes. Simplification and cost reduction brought about a decrease in the number of the steps can make a bigger difference when many circuit patterns are formed for fabrication of an electronic circuit as a product.

When the material used for preparation of the thin film 3 or the insulating layer 5 can be directly removed by direct irradiation of a laser beam or the like, it is possible to provide a method for forming a pattern under a more effective dry condition by combination of a dry lift-off method since the pattern can be directly formed.

The pattern forming method according to the present invention can form a pattern with a high precision of about 0.1 μm, which depends on the resolution of an opening pattern of a mask layer, and can be applied to formation of a pattern having a large screen size, such as a flat panel display. The present invention can provide a pattern forming method having high precision, low environmental burden and excellent cost performance, an electronic circuit fabricated by the same, and an electronic device using the same.

EXAMPLE

Although the present invention will be more specifically described based on examples, the present invention is not limited to the examples described below.

Example 1

Figure 6:
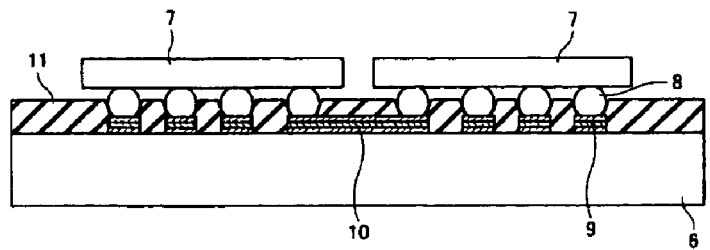
FIG. 6 is a cross-sectional view of the electronic circuit in Example 1 of the present invention.
Figure 7:
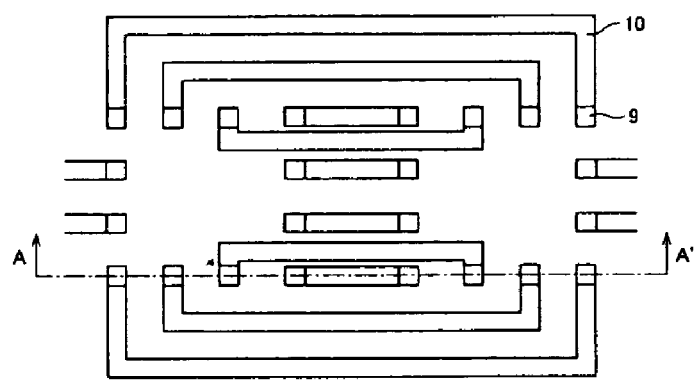
FIG. 7 is a plan view of the thin-film circuit pattern in Example 1 of the present invention.
Figure 8:
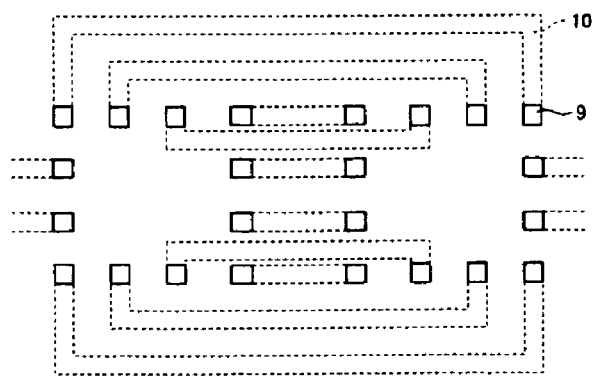
FIG. 8 is a plan view of the thin-film circuit pattern in Example 1 of the present invention.

In this example, explanation will be made, based on FIG. 6 through FIG. 10, about a case which is suited for a process for using a thin film to form electrodes and wires in order to fabricate a high density of electronic circuit module with LSI (Large-Scale Integration) circuits mounted in a high density thereon. FIG. 6 is a cross-sectional view showing a portion of a thin film circuit pattern with two LSI circuits mounted thereon. As shown in FIG. 6, a glass substrate 6 has electrodes 9 and a wiring pattern 10 formed thereon, the electrodes being connected, through a coupling agent 8, to LSI circuits 7 having twelve terminals, and the wiring pattern making connection between the electrodes 9. FIG. 7 is a plan view partly showing the electrodes 9 and the wiring pattern 10 before mounting of the two LSI circuits 7. FIG. 6 is a cross-sectional view taken along the line A-A' of FIG. 7, looking in the direction of the arrows. FIG. 8 is a plan view showing a state wherein the wiring pattern 10 formed as shown in FIG. 7 is covered with an insulating layer 11 so as to expose only the electrodes 9, and wherein a high density of electronic circuit module has been completed.

Now, the pattern forming method in this example will be described in detail, referring to FIG. 6 through FIG. 10. Each of the electrodes and the wiring pattern 10 comprises a metal material which is constituted by three layers of Cr (about 0.1 μm)/Cu (about 2 μm)/Au (about 0.05 μm) as a combination of lower-layer/intermediate-layer/upper-layer in this order. Cr is used for the purpose of adhesion to the glass substrate 6, Cu is used for the purpose of formation of low resistant wires, and Au is used for the purpose of surface protection on connection, and antioxidation and anticorrosion of Cu. However, Al, Ni, Ti, W or the like may be used according to a desired purpose. The thin films of the respective metal layers are vacuum-deposited by a sputtering system.

Figure 9A:
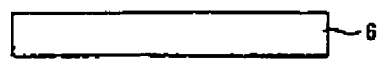
FIGS. 9(a) to (c) are cross-sectional views showing a schematic structure of an electronic circuit.
Figure 9B:
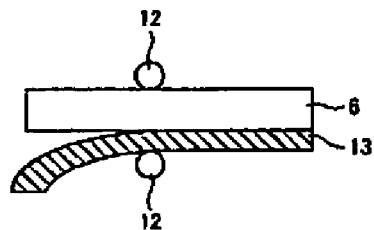
Figure 9C:
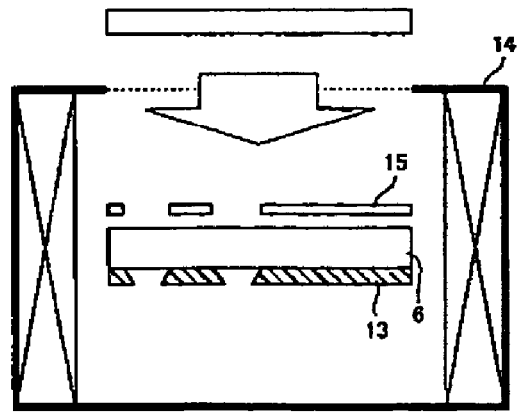

FIG. 9 and FIG. 10 are schematic views showing the process for forming the thin film circuit pattern in this example. The process for forming the thin film circuit pattern comprises (1) a step for applying a resist film (FIG. 9(a) and (b)), (2) a step for forming a resist pattern by irradiation of a laser beam (FIG. 9(c)), (3) a step for depositing a thin film (FIG.

Figure 10A:
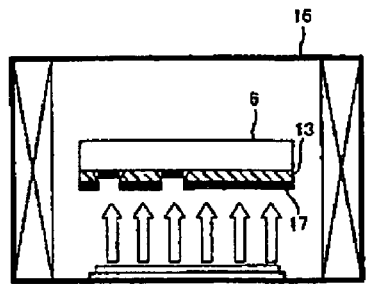
FIGS. 10(a) to (d) are cross-sectional views showing a schematic structure of the electronic circuit.
Figure 10B:
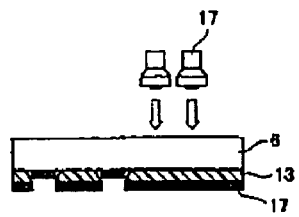
Figure 10C:
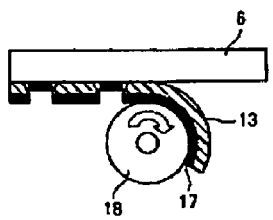
Figure 10D:
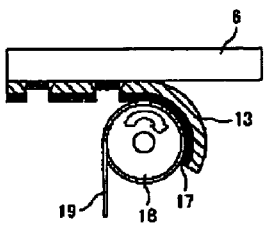

10(a)), (4) a step for reducing the adhesion property of the resist film by irradiation of an UV ray (FIG. 10(b)), and (5) a step for mechanically removing the mask layer (FIG. 10(c) and (d)). As shown in FIG. 9(b), first, a photosensitive dry film resist having a thickness of 25 µm is uniformly stuck on a glass substrate 6 by a film laminator 12. After that, the glass substrate 6 is put into a depressurized chamber 14, and an excimer laser beam or a YAG laser beam is irradiated from an opening window of the depressurized chamber through a circuit pattern mask 15 (FIG. 9(c)). By this treatment, the resist film 13 is subjected to ablation so as to form a resist pattern with a reverse tapered shape in cross-section. After that, the glass substrate 6 is put into a sputter coating system 16 to sequentially deposit films of Cr, Cu and Au in this order by sputtering (FIG. 10(a)) on the glass substrate 6 and the resist film 13. The metal thin-film multilayer 17 thus deposited has a total thickness of about 2 to 3 µm, and the metal thin-film multilayer 17 is deposited, being completely divided into portions on the resist film 13 and portions on the glass substrate 6.

After that, the adhesion between the glass substrate 6 and the resist film 13 is reduced by irradiating an ultraviolet ray from a rear surface of the glass substrate 6 by use of an ultraviolet ray curing system 17 (e.g., product name: Metal Halide Lamp, manufactured by USHIO INC, having a wavelength of 300 to 450 nm) (FIG. 10(b)). Then, a remover with a roller 18 peels off the unnecessary resist film 13 from the glass substrate 6 so as to slowly wind the film around the roller (FIG. 10(c)). By this treatment, a circuit pattern is formed on the glass substrate 6. By placing a removing tape 19, which adheres to the resist film 13, on a surface of the roller 18, it is possible to remove the resist film more easily since the resist film 13 is bonded to the removing tape during winding the unnecessary resist film 13 (FIG. 10(d)).

In a case where a mask or the like is used to prevent a metal thin-film layer from being deposited on the resist film 13 on an edge portion of the substrate 6 when depositing the metal thin-film multilayer 17, the resist film 13 can be more reliably removed from the glass substrate 6 by bonding an exposed edge portion of the resist film 13 to the roller 18 before starting winding.

Example 2

Figure 11:
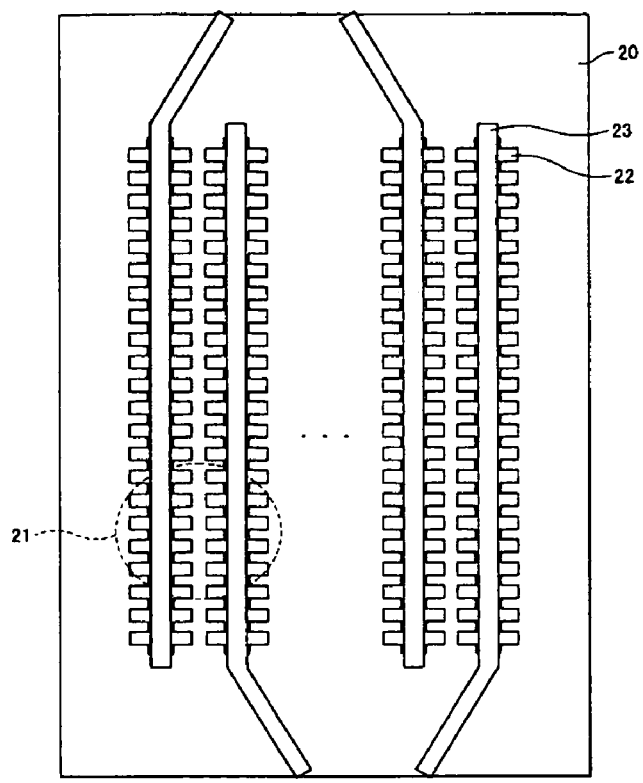
FIG. 11 is a plan view of the thin-film circuit pattern in Example 2 of the present invention.
Figure 12:
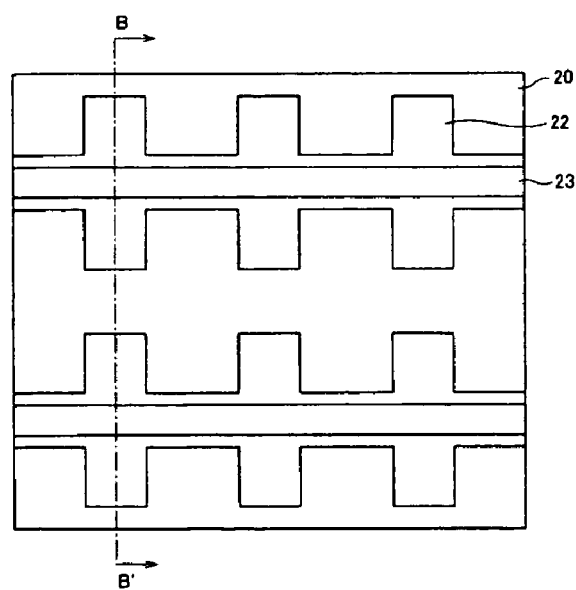
FIG. 12 is a plan view shown an enlarged schematic structure of the thin-film circuit pattern in Example 2 of the present invention.

Now, the pattern forming method according to a second example will be described, based on FIG. 11 through FIG. 14, about a plasma display (hereinbelow, referred to as "PDP"), which is a typical flat panel display. FIG. 11 shows a representative electrode wiring pattern, which is formed on a surface of a glass substrate 20 as the screen side of a PDP. FIG. 12 is an enlarged view of a portion encircled by the dotted circle 21 in FIG. 11. The electrodes have a typical structure wherein transparent electrodes 22 made of ITO, $SnO_2$ or the like are integrally combined with bus electrodes 23 made of a combination of Cr/Cu/Cr, Cr/Al/Cr or the like and serving as power feeding lines, forming many linear patterns so as to correspond to the number of pixels. In the electrode wiring pattern in this example shown in FIG. 13 and FIG. 14, a pair of a transparent electrode layer 22 and a bus electrode layer 23 is formed, and each of the layers may be fabricated by substantially the same process shown in FIG. 9 and FIG. 10. However, it should be noted that the process is formed under a condition of being capable of completely removing a resist film by irradiation of an ultraviolet ray, the intensity of which is increased by about 1.5 times in comparison with Example 1. By this treatment, it is possible to form a desired thin film circuit pattern even through the transparent electrodes 22 by a so-called dry lift-off method.

Figure 13:
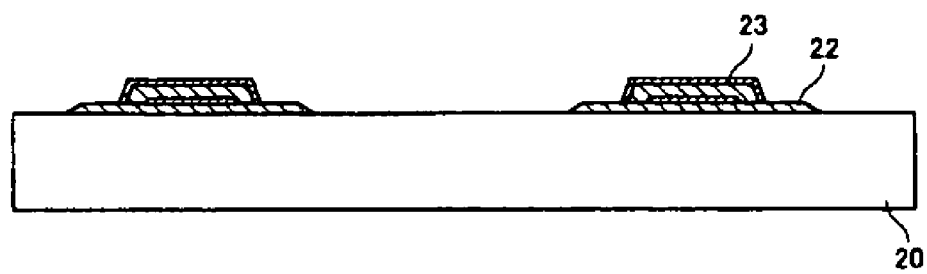
FIG. 13 is a cross-sectional view shown a schematic structure of a thin-film circuit pattern in Example 2 of the present invention.

FIG. 13 is a cross-sectional view taken along the line B-B' of FIG. 12, looking in the direction of the arrows. In the example shown in FIG. 13, the bus electrodes 23 are formed after the transparent electrodes 22 are formed on the substrate 20. When a resist mask is used to form a thin film comprising a plurality of layers as shown in FIG. 13, the thin film is deposited so as to have film edges rounded since deposition is performed with sputtered atoms slightly oozing out of edge portions of an opening pattern. Further, a layer to be subsequently deposited is deposited so as to cover the edge portions of a lower layer. In particular, when the bus electrodes 23 comprise a layer structure of Cr/Cu/Cr, it is possible to expect to have a great advantage of preventing Cu from being exposed since Cu, which is apt to be oxidized and corroded, is finally covered with Cr. Additionally, since the example shown in FIG. 13 does not need to be etched, this example has a great advantage of being capable of using Au, $SnO_2$ or the like, which has not been applied to a product up to now because of difficulty in etching FIG. 14 shows an example wherein the bus electrodes 23 and the transparent electrodes 22 are formed in reverse fashion to those shown in FIG. 13. In other words, in the structure shown in FIG. 14, the transparent electrodes 22 are formed after the bus electrodes 23 are formed on the substrate 20. By adopting such arrangement, it is possible to form a thin film circuit pattern with higher reliability since the transparent electrodes 22 cover the highly reactive metal thin film (the bus electrodes 23).

The transparent electrodes 22 shown in FIG. 13 and FIG. 14 may be formed by removal processing using the irradiation of a laser beam as an alternative to the same process as those shown in FIG. 9 and FIG. 10. In other words, since the transparent electrodes 22, which comprise ITO, $SnO_2$ or the like, can be directly and easily removed by irradiation of an excimer laser beam or a YAG laser beam, the bus electrodes (Cr/Cu/Cr) 23 shown in FIG. 13 and FIG. 14 are formed by a dry lift method, and then unnecessary portions of the transparent electrodes are directly removed by irradiation of such an excimer laser beam or such a YAG laser beam. Thus, it is possible to obtain a desired thin film circuit pattern in a more effective way under a dry condition.

In the structure shown in FIG. 14, a thin film for formation of the transparent electrodes 22 may be formed and be directly processed by a laser beam, followed by forming the bus electrodes 23, or a thin film for formation of the transparent electrodes 22 may be formed, followed by forming the bus electrodes 23 on the thin film and then directly removing unnecessary portions of the transparent electrodes 22 by a laser beam.

Although explanation has been made about the cases of formation of a thin film circuit pattern for an electronic device and a PDP as a typical flat display panel with respect to Examples 1 and 2 stated above, it should be noted that the present invention is applicable to all devices, such as other flat display products, and optical waveguide modules, which include a thin film pattern comprising an organic material or an inorganic material. It should be also noted that the present invention is applicable to materials or film deposition systems other than referred to in the explanation with respect to Examples 1 and 2, that is to say, e.g., vacuum deposition, PVD (Physical Vapor Deposition), such as ion plating, and various kinds of CVD as chemical vapor deposition.

Example 3

The pattern forming method according to another example will be described, based on FIG. 9 through FIG. 14, about a PDP as a typical flat panel display.

FIG. 11 is a plan view showing a schematic structure of a thin film circuit pattern (electrode wiring pattern), which is formed on a surface of a glass substrate 20 as the screen side of a PDP. FIG. 12 is a plan view of a portion encircled by the dotted circle 21 in FIG. 11.

The electrode wiring pattern of this example is configured so that a pair of a transparent electrode layer 22 and a bus electrode layer 23 is formed as shown in FIG. 13 or FIG. 14 (each being a cross-sectional view showing a schematic structure of a thin film circuit pattern in Example 3), more specifically, transparent electrodes (thin-film layer) 22 made of ITO are integrally combined with bus electrodes (thin-film layer) 23 made of a combination of Cr/Cu/Cr and serving as power feeding lines, forming many linear patterns so as to correspond to the number of pixels.

In this example, the mask layer is a film which comprises a mask layer forming material made of an acrylic resin containing 40 mass % of carbon black (hereinbelow, referred to as "mask film"), and the laser beam comprises a YAG laser beam which has a wavelength of 1,064 nm and an energy density of 0.5 J/cm$^2$.

The mask film, and the thin-film layers for the transparent electrodes and the bus electrodes may be formed by the process for forming a thin film circuit pattern as shown in FIG. 9 and FIG. 11.

As shown in FIG. 9 and FIG. 10, the thin film circuit pattern is formed through (1) a step for applying the mask film (FIG. 9(a) and (b)), (2) a step for forming an opening pattern by irradiation of the laser beam (FIG. 9(c)), (3) a step for depositing a thin film (FIG. 10(a)), and (4) a step for removing the mask layer by irradiation of the laser beam (FIG. 10(b)).

Specifically, first, the mask film 13 having a thickness of 25 μm is uniformly stuck on the glass substrate 11 by a film laminator 12 (FIG. 9(b)). After that, the substrate 11 is put into a depressurized chamber 14, and the YAG laser beam is irradiated from an opening of the depressurized chamber through a circuit pattern mask 15 (FIG. 9(c)). By this treatment, the mask film 13 is processed so as to have a reverse tapered shape in cross-section. After that, the glass substrate 11 is put into a sputter coating system 16 to deposit a thin-film layer 17 on the glass substrate 11 and the mask film 13 by sputtering (FIG. 10(a)). The thin-film layer has a thickness of about 2 to 3 μm, and the thin-film layer 17 is deposited, being completely divided into portions on the mask film 13 and portions on the glass substrate 11.

Next, the mask layer and the thin-film layer formed on the mask layer are removed by irradiation of the laser beam from a side of the substrate without the mask layer formed thereon (FIG. 10(b)). The laser beam has the same wavelength and the same energy density as that used for formation of the opening pattern in the mask layer. The electrode wiring pattern shown in FIG. 13 or FIG. 14 is formed by fabricating the transparent electrodes and the bus electrodes by the above-mentioned process as explained.

When the electrode wiring pattern includes electrodes in the mode shown in FIG. 13 (which is a cross-sectional view taken along the line B-B' of FIG. 12, looking in the direction of the arrows), the electrode wiring pattern may be formed by forming the transparent electrodes 22 on the glass substrate 20 by the above-mentioned process, followed by forming the bus electrodes 23 by the above-mentioned process.

When a thin-film layer is formed so as to comprise a plurality of layers as shown in FIG. 13 by use of a circuit pattern mask, the thin film is deposited so as to have film edges rounded since deposition is performed with sputtered atoms slightly oozing out of edge portions of an opening pattern. Further, a layer to be subsequently deposited is deposited so as to cover the edge portions of a lower layer. In particular, when the bus electrodes 23 comprise a layer structure of Cr/Cu/Cr, it is possible to expect to have a great advantage of preventing Cu from being exposed since Cu, which is apt to be oxidized and corroded, is finally covered with Cr. Additionally, since the example shown in FIG. 13 does not need to be etched, this example has a great advantage of being capable of using Au, SnO$_2$ or the like, which has not been applied to a product up to now because of difficulty in etching.

FIG. 14 shows an example wherein the bus electrodes 23 and the transparent electrodes 22 are formed in reverse fashion to those shown in FIG. 13. In other words, in the structure shown in FIG. 14, the transparent electrodes 22 are formed after the bus electrodes 23 are formed on the substrate 20. By adopting such arrangement, it is possible to form a thin film circuit pattern with higher reliability since the transparent electrodes 22 cover the bus electrodes 23 as a highly reactive metal thin film.

The transparent electrodes 22 shown in FIG. 13 and FIG. 14 may be formed by the process shown in FIG. 9 and FIG. 10 as stated above or may be formed by direct patterning by irradiation of a laser beam. In other words, since the transparent electrodes 22, which comprise ITO, can be directly and easily removed by irradiation of a YAG laser beam (having an energy density of 3 mJ/cm$^2$ or above), the bus electrodes shown in FIG. 13 and FIG. 14 are formed by a dry lift method, and then unnecessary portions of the transparent electrodes are directly removed by irradiation of such a YAG laser beam. Thus, it is possible to obtain a desired thin film circuit pattern in a more effective way under a dry condition.

In the electrode structure shown in FIG. 14, a thin film for formation of the transparent electrodes 22 may be formed and be directly patterned by the laser beam, followed by forming the bus electrodes 23, or a thin film for formation of the transparent electrodes 22 may be formed, followed by forming the bus electrodes 23 on the thin film and then directly patterning the transparent electrodes 22 by the laser beam.

INDUSTRIAL APPLICABILITY

As explained, the pattern forming method according to the present invention can decrease the number of the steps by performing the process under a dry condition, reducing the cost and the environmental burden. For this reason, the present invention is particularly suited to a product, which is fabricated by a process including many lithographic steps, such as a semiconductor, a PDP or other flat panel display panels. Accordingly, the present invention is widely applicable to the electronics parts industry for manufacturing circuit boards or the like, to an electronic devices industry using circuit boards, and to other industries.

The entire disclosures of Japanese Patent Application No. 2003-381662 filed on Nov. 11, 2003 and Japanese Patent Application No. 2004-195306 filed on Jul. 1, 2004 including specifications, claims, drawings and summaries are incorporated herein by reference in their entireties.

What is claimed is:

1. A method for forming a pattern, comprising:
forming a mask layer on a substrate;
forming, under dry conditions, an opening in the mask layer using a first laser beam to irradiate the mask layer, the mask layer being ablated by the first laser beam in an area of the opening such that the opening in the mask layer having an inverse taper shape or an overhang shape after formation of the opening;
forming a thin-film layer on the substrate and on the mask layer; and
removing, from the substrate, the mask layer and a portion of the thin-film layer formed on the mask layer,
wherein an absorption coefficient of the mask layer is at least two times greater than an absorption coefficient of the substrate and an absorption coefficient of the thin-film layer with respect to the first laser beam, wherein the forming of the mask layer and the forming of the opening in the mask layer are performed by forming a first mask layer on the substrate, irradiating the first mask layer with the first laser beam from a side of the first mask layer to form a first opening pattern in the first mask layer, and by forming a second mask layer on the first mask layer, irradiating the second mask layer with the first laser beam from a side of the second mask layer to form a second opening pattern in the second mask layer, the second opening pattern having a smaller size that the first opening pattern.

2. A method for forming a pattern, comprising:
forming a mask layer on a substrate;
forming, under dry conditions, an opening in the mask layer using a first laser beam to irradiate the mask layer, the mask layer being ablated by the first laser beam in an area of the opening such that the opening in the mask layer having an inverse taper shape or an overhang shape after formation of the opening;
forming a thin-film layer on the substrate and on the mask layer; and
removing, from the substrate, the mask layer and a portion of the thin-film layer formed on the mask layer,
wherein an absorption coefficient of the mask layer is at least two times greater than an absorption coefficient of the substrate and an absorption coefficient of the thin-film layer with respect to the first laser beam, wherein the forming of the opening in the mask layer is performed by irradiating the mask layer with the first laser beam from a side of the mask layer to provide the mask layer with an opening pattern in a forward tapered shape, shifting a focus of the first laser beam toward the substrate, and irradiating the mask layer with the first laser beam from the side of the mask layer to form the opening pattern in a target shape.

3. A method for forming a pattern, comprising:
forming a mask layer on a substrate;
forming, under dry conditions, an opening in the mask layer using a first laser beam to irradiate the mask layer, the mask layer being ablated by the first laser beam in an area of the opening such that the opening in the mask layer having an inverse taper shape or an overhang shape after formation of the opening;
forming a thin-film layer on the substrate and on the mask layer; and
removing, from the substrate, the mask layer and a portion of the thin-film layer formed on the mask layer,
wherein an absorption coefficient of the mask layer is at least two times greater than an absorption coefficient of the substrate and an absorption coefficient of the thin-film layer with respect to the first laser beam, wherein the forming of the opening in the mask layer is performed by irradiating the mask layer with the first laser beam from a side of the mask layer to provide the mask layer with an opening pattern, and irradiating the mask layer with the first laser beam from a side of the substrate to form the opening pattern in a target shape.

* * * * *